US011864347B2

(12) United States Patent
Engelhardt et al.

(10) Patent No.: US 11,864,347 B2
(45) Date of Patent: Jan. 2, 2024

(54) HEAT SINK ASSEMBLIES FOR TRANSIENT COOLING

(71) Applicant: GE AVIATION SYSTEMS LLC, Grand Rapids, MI (US)

(72) Inventors: Michel Engelhardt, Woodbury, NY (US); Paul Otto Stehlik, Northport, NY (US); Judd Everett Swanson, Cooper City, FL (US)

(73) Assignee: GE Aviation Systems LLC, Grand Rapids, MI (US)

( * ) Notice: Subject to any disclaimer, the term of this patent is extended or adjusted under 35 U.S.C. 154(b) by 424 days.

(21) Appl. No.: 16/653,256

(22) Filed: Oct. 15, 2019

(65) Prior Publication Data

US 2020/0053908 A1 Feb. 13, 2020

Related U.S. Application Data

(63) Continuation of application No. 15/526,475, filed as application No. PCT/US2015/060441 on Nov. 12, 2015, now Pat. No. 10,485,138.

(60) Provisional application No. 62/078,620, filed on Nov. 12, 2014.

(51) Int. Cl.
*H01L 23/427* (2006.01)
*H05K 7/20* (2006.01)

(52) U.S. Cl.
CPC ....... *H05K 7/2029* (2013.01); *H01L 23/4275* (2013.01); *H05K 7/20509* (2013.01); *H01L 2924/0002* (2013.01)

(58) Field of Classification Search
CPC .......................... H05K 7/2029; H01L 23/4275
USPC .................................................. 165/10, 164
See application file for complete search history.

(56) References Cited

U.S. PATENT DOCUMENTS

| 3,095,923 A | * | 7/1963 | Foutz ......................... F28B 1/06 165/164 |
| 3,328,642 A | | 6/1967 | Haumesser et al. |
| 3,602,298 A | * | 8/1971 | Ciesielski ............... F28F 13/00 165/164 |
| 3,780,356 A | | 12/1973 | Laing |
| 4,057,101 A | | 11/1977 | Ruka et al. |
| 4,322,737 A | | 3/1982 | Silwa, Jr. |
| 5,597,035 A | | 1/1997 | Smith et al. |
| 5,631,799 A | | 5/1997 | Sayka |
| 6,212,074 B1 | | 4/2001 | Gonsalves et al. |

(Continued)

FOREIGN PATENT DOCUMENTS

| CN | 102027805 A | 4/2011 |
| DE | 102012222459 A1 | 6/2014 |

(Continued)

OTHER PUBLICATIONS

Japanese Patent Office, Office Action re Japanese Patent Application No. 2017-522586, dated Dec. 2, 2019, 4 pages, Japan.

*Primary Examiner* — Eric S Ruppert
(74) *Attorney, Agent, or Firm* — McGarry Bair PC (57) ABSTRACT

A heat sink assembly for use with at least one heat-emitting component where the heat sink assembly includes a first phase change material conductively coupled to the at least one heat-emitting component and changing phase at a first temperature and a second phase change material conductively coupled to the first phase change material and changing phase at a second temperature, which is greater than the first temperature.

17 Claims, 9 Drawing Sheets

(56) References Cited

U.S. PATENT DOCUMENTS

| | | |
|---|---|---|
| 6,239,502 B1 | 5/2001 | Grewe et al. |
| 7,940,527 B2 | 5/2011 | Krause |
| 7,989,839 B2 | 8/2011 | Dahm |
| 8,081,465 B2 | 12/2011 | Nishiura |
| 9,036,352 B2 | 5/2015 | Engelhardt et al. |
| 9,102,857 B2 | 8/2015 | Weaver et al. |
| 2004/0250989 A1 | 12/2004 | Im et al. |
| 2005/0007740 A1 | 1/2005 | Neuschuetz et al. |
| 2008/0123297 A1 | 5/2008 | Tilton et al. |
| 2009/0219726 A1 | 9/2009 | Weaver et al. |
| 2011/0038122 A1 | 2/2011 | Ahangar et al. |
| 2012/0276327 A1 | 11/2012 | Cola et al. |
| 2012/0280382 A1 | 11/2012 | Im et al. |
| 2012/0305213 A1* | 12/2012 | Tsukahara ............. F28D 20/023 165/10 |
| 2013/0098417 A1 | 4/2013 | Gavillet |
| 2014/0216027 A1* | 8/2014 | Iida ....................... F28D 20/026 60/529 |
| 2014/0317389 A1* | 10/2014 | Wenisch ................. G06F 1/329 712/229 |
| 2014/0369005 A1 | 12/2014 | Gavillet et al. |
| 2015/0266144 A1* | 9/2015 | Bengaouer ............ F28D 20/021 165/10 |
| 2016/0233145 A1 | 8/2016 | Caroff et al. |

FOREIGN PATENT DOCUMENTS

| | | | |
|---|---|---|---|
| EP | 2738803 A2 | | 6/2014 |
| JP | 2009303316 A | | 12/2009 |
| JP | 2011513989 A | | 4/2011 |
| JP | 2014110426 A | | 6/2014 |
| JP | 2014179483 A | * | 9/2014 |
| JP | 2014179483 A | | 9/2014 |

\* cited by examiner

HEAT SINK ASSEMBLIES FOR TRANSIENT COOLING

CROSS-REFERENCE TO RELATED APPLICATIONS

This application is a continuation of U.S. patent application Ser. No. 15/526,475, filed May 12, 2017, now issued as U.S. Pat. No. 10,485,138, issued Nov. 19, 2019, which is a national phase application of International Application No. PCT/US2015/060441, filed Nov. 12, 2015, which claims the benefit of U.S. Patent Application Ser. No. 62/078,620, titled "HEAT SINK ASSEMBLIES FOR TRANSIENT COOLING" and having filing date Nov. 12, 2014, all of which are incorporated by reference herein.

BACKGROUND

Heat producing devices, such as printed circuit boards, often contain heat producing components, such as processors, resistors, capacitors, or voltage regulators. A thermal plane may be provided in combination with the heat producing devices to form an assembly to aid in the removal of heat, typically by providing additional conductive pathways to disperse the heat. Typically, air cooling and liquid cooling systems are used in open environments where the heat may be dissipated to the surroundings. In certain instances, the heat producing components may operate under transient modes of increased heat production where high heat dissipations are expected over short durations.

BRIEF DESCRIPTION

An aspect of the present disclosure includes a first phase change material conductively coupled to the at least one heat-emitting component and changing phase at a first temperature, a first frame holding the first phase change material, a second phase change material conductively coupled to the first phase change material and changing phase at a second temperature, which is greater than the first temperature, a second frame holding the second phase change material, an intermediate heat-conducting structure located between the first frame and the second frame wherein the first phase change material changes phase in response to a conductive transfer of heat from the heat-emitting component and the second phase change material changes phase in response to a conductive transfer of heat from the first phase change material

DETAILED DESCRIPTION

Figure 1A:
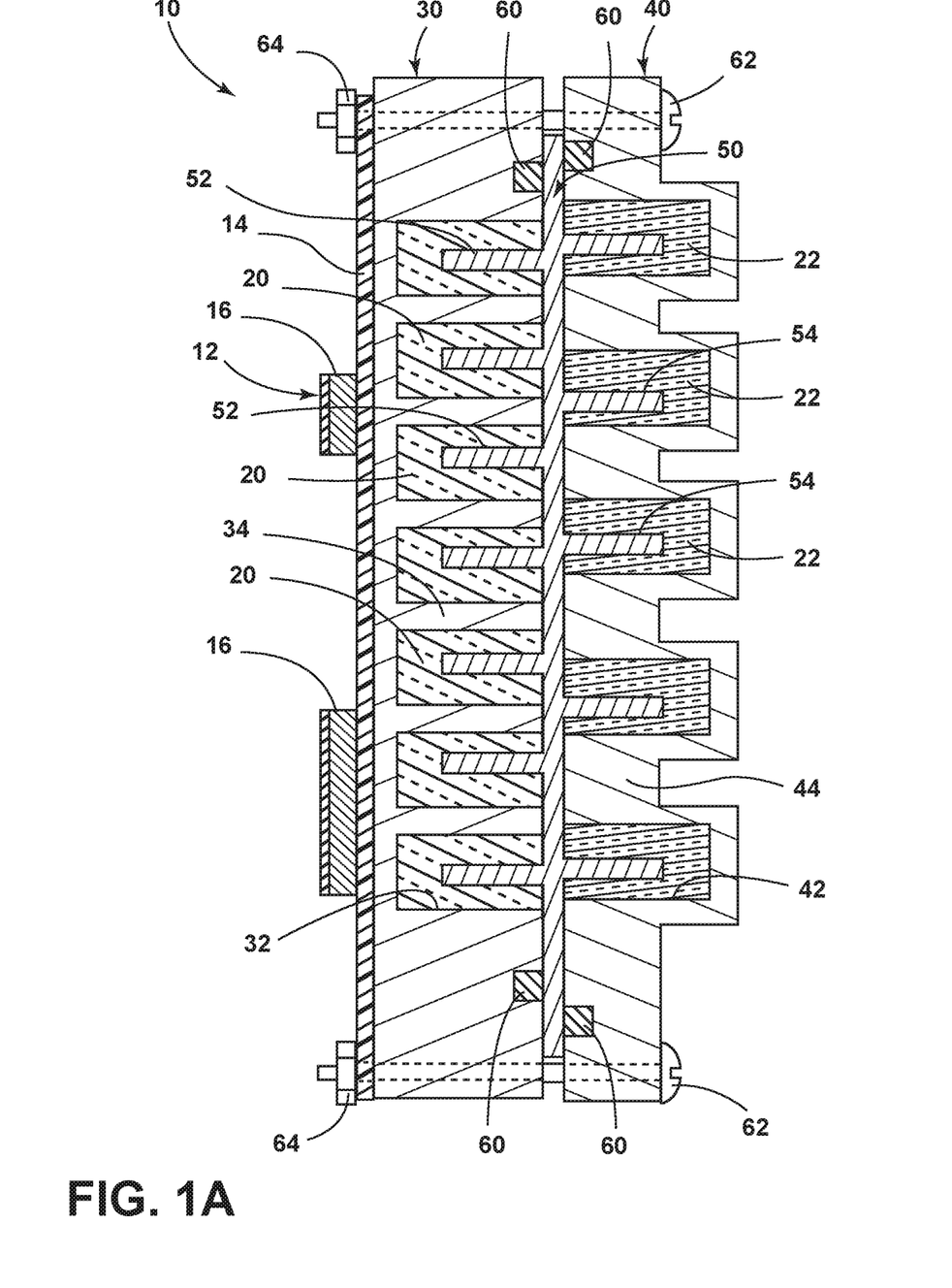
FIGS. 1A-1B illustrates an example heat sink assembly in accordance with various aspects described herein.
Figure 1B:
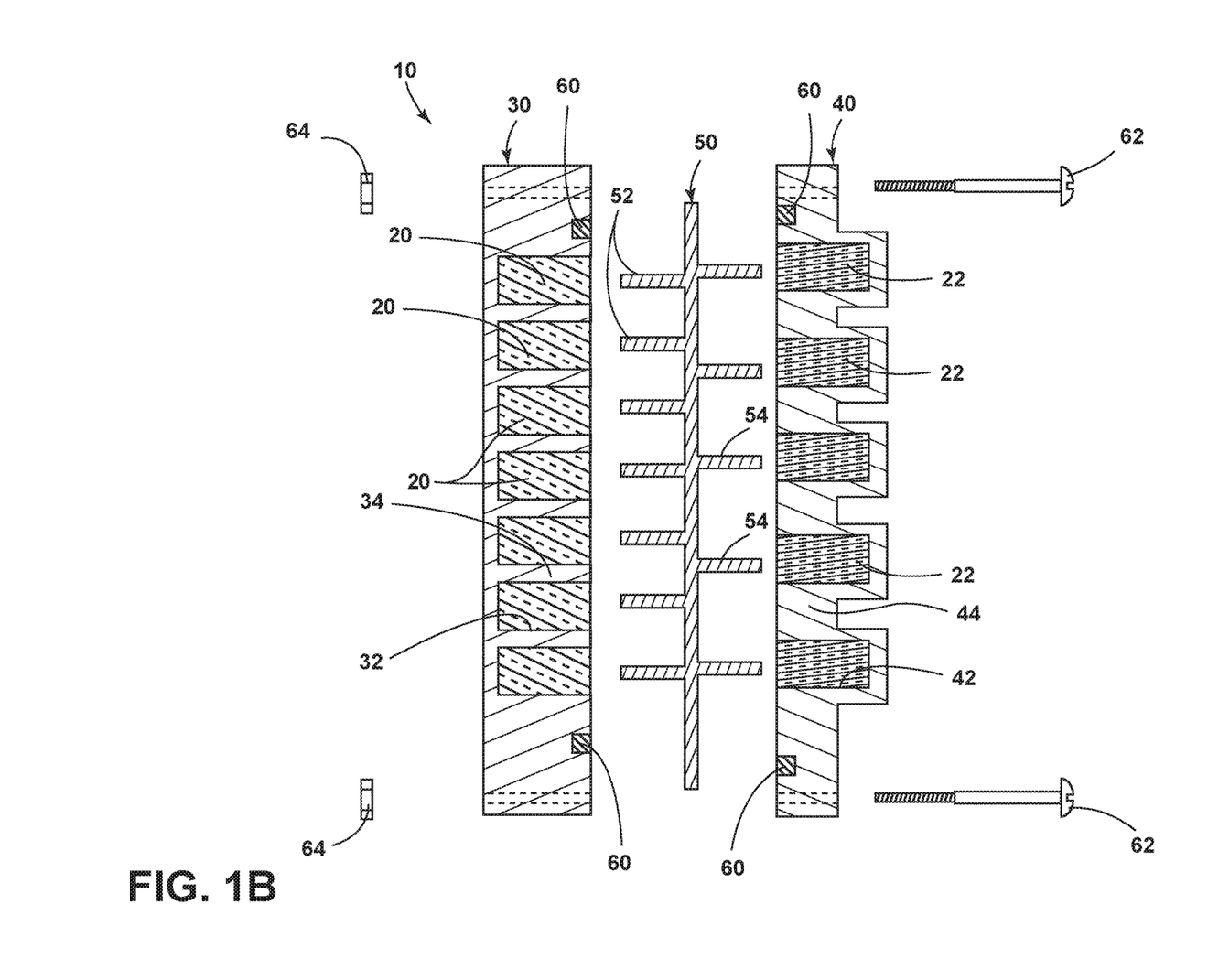

FIG. 1A illustrates a cross section of a heat sink assembly 10 for use with a heat-emitting component 12. The heat-emitting component 12 may be any heat-emitting component including any electronic heat-emitting component that requires thermal management such as a microprocessor, high heat flux Printed Circuit Boards (PCBs), pulse laser control board (PLCB), capacitors, electronics including MOSFETs, and any other device that needs cooling. The heat sink assembly 10 may be used with airborne, shipboard, and ground based electronics including medical equipment. The heat sink assembly 10 may also be used with any other conceivable heat-emitting device and a variety of heat loads including transient heat loads. By way of non-limiting examples, the heat sink assembly 10 may be used for managing solar heat, laser heat, electronic heat, etc. For exemplary purposes only, the heat-emitting component 12 has been illustrated as a printed circuit board (PCB) 14 having heat producing components 16, shown as microprocessors. Although microprocessors are illustrated, additional heat producing components 16, such as power regulators, resistors, inductors, capacitors, etc., may be provided on the PCB.

The heat sink assembly 10 may be a transient cooling assembly incorporating two different phase change materials each changing phase at a different temperature such that the heat sink assembly 10 may act as a double thermal capacitor. More specifically, a first phase change material 20 may be conductively coupled to the at least one heat-emitting component 12 and the first phase change material may change phase at a first temperature and a second phase change material 22 may be conductively coupled to the first phase change material 20 and may change phase at a second temperature, which is greater than the first temperature.

The first phase change material 20 and second phase change material 22 may be any suitable phase change materials having different phase change temperatures. The first phase change material 20 and second phase change material 22 may include materials that go through a solid/liquid phase change and/or a liquid/gas phase change. Depending on the application, the phase change materials may be appropriately selected. For example, in aviation, paraffin waxes are typically used because they are not corrosive. Such paraffin waxes are solids that change phase to a liquid when sufficient heat is absorbed and further change phase from a liquid back to a solid when sufficient heat is released. After the phase change from solid to liquid, the paraffin wax is able to further absorb supplementary heat, beyond the heat causing the phase change to occur. The paraffin wax is configured to repeatedly change phase from a solid to a liquid, and back to a solid, reliably for multiple cycles.

Other phase change materials, for example ammonia, are envisioned, so long as the material changes phase from a starting phase to at least one different phase in response to the conductive transfer of heat. The starting phase and at least one different phase may be one of solid, liquid, and gas. Returning to a previous example, the paraffin wax may also include an additive material, such as carbon black, to increase heat transfer. Non-limiting examples of additional phase change materials may include Indrastat 84, Indrastat 69, Rubitherm RT70 HC, Rubitherm RT80HC, aluminum Nitrate nonahydrate, sodium pyrophosphate decahydrate, barium hydroxide octahydrate, aluminum potassium sufate dodecahydrate, cerrobend eutectic, bi-in eutectic, cerrosafe eutectic, stearic acid, palmitic acid, myristic acid, and/or lauric acid.

The first phase change material 20 and the second phase change material 22 may be included in the heat sink assembly 10 in any suitable manner. For example, a first frame 30 may be included to hold the first phase change material 20. The first frame 30 has been illustrated as defining a plurality of chambers 32 in which the first phase change material 30 is received. The first frame 30 may be formed in any suitable manner and has been illustrated as a grid of interconnected walls 34, which may define the plurality of chambers 32 having any suitable cross section. Other types of frame structures, both grid and non-grid, are contemplated. The first frame 30 may be conductive such that it enhances the conduction of heat into and away from the first phase change material 20 within the heat sink assembly 10.

In this manner, the first frame 30 shown operates to segregate the phase change material in separate chambers 32, while providing an interconnected heat conduction path from the heat-emitting component 12 to the plurality of chambers 32 of the first phase change material 20.

The first frame 30 may have at least a portion that is conductively coupled to the at least one heat-emitting component 12. Alternatively, multiple portions may be conductively coupled to the at least one heat-emitting component 12 or the entirety of the first frame 30 may be formed from a conductive material. For example, the first frame may be aluminum, copper, steel, nickel, or copper tungsten, etc., any of which may provide similar structural and heat conductive properties.

Further, a second frame 40 may be included for holding the second phase change material 22. The second frame 40 may be similar to the first frame 30 including that the second frame 40 may have a plurality of chambers 42 formed by interconnected walls 44. The second frame 40 may also be formed from conductive material or have portions, which are formed from conductive material. Further still, the first frame 30 and the second frame 40 can be configured as honeycombs.

Further still, a conductive element or an intermediate heat-conducting structure 50 may be included in the heat sink assembly 10 and may be located between the first phase change material 20 and the second phase change material 22. The intermediate heat-conducting structure 50 may define a structural barrier between the first phase change material 20 and the second phase change material 22. In the illustrated example, the intermediate heat-conducting structure 50 is separate from the first frame 30 and the second frame 40. It will be understood that this need not be the case and that the intermediate heat-conducting structure 50 may be operably coupled to, integrally formed with, or be a portion of either the first frame 30 and/or the second frame 40. The intermediate heat-conducting structure may conductively couple the first phase change material 20 and the second phase change material 22.

In the illustrated example, the intermediate heat-conducting structure 50 includes a plurality of fins 52 extending into the first phase change material 20 and a plurality of fins 54 extending into the second phase change material 22. While a single fin has been illustrated as extending from the intermediate heat-conducting structure 50 into each of the visible chambers 32, and 42, it will be understood that a fin does not need to extend into each of the chambers and that any number of fins may extend into the chambers. It will be understood that the intermediate heat-conducting structure 50 may be any suitable structure, which provides a thermal interface between the first phase change material 20 and the second phase change material. The intermediate heat-conducting structure 50 also creates a barrier for isolating the first phase change material 20 from the second phase change material 22 to ensure that they do not mix.

Seals 60 may also be included in the heat sink assembly 10 to keep the phase change materials 20 and 22 properly within the assembly. Any suitable seals may be included including rubber gaskets. One or more fastening components may be included to hold the first frame 30 and the second frame 40 together. As illustrated, the fastening component comprises a fastener, shown as a screw 62, received through openings in the first frame 30 and the second frame 40 and engaging a nut 64. Any suitable fastening component may be used. For example, other mechanical fasteners, e.g. bolts, nails, pins, etc., may be used as well as non-mechanical fasteners, such as welding or adhesive. Further, fasteners may be used to aid in the mounting of the first frame 30 to the PCB 14 may also be included.

During operation of the PCB 14 the heat producing component 16 on the PCB 14, may by way of non-limiting example, use electrical power over short durations (on the order of seconds), creating a mode of high power consumption interspersed with modes of low power consumption, and as a result, the need for transient high heat dissipation during the high power consumption modes. During these transient durations, the heat produced by the heat-producing component 16 is transferred by conduction to the heat sink assembly 10 by the first frame 30 conducting the heat to the first phase change material 20, where the heat is absorbed. Heat is then conductively transferred from the first phase change material 20 through the intermediate heat-conducting structure 50 to the second phase change material 22. The second phase change material 22 changes phase at a higher temperature than the first phase change material 20. Heat may then be conducted through the frame 40 to an ultimate heat sink surrounding the heat sink assembly 10. In this manner, it will be understood that heat is transferred from the second phase change material 22 to a material exterior of the heat sink assembly 10. While not illustrated, the outer surface of the frame 40 may include fins that are exposed to the ultimate heat sink. The ultimate heat sink can be a gas, a liquid, or a solid material. In the case of a gas, the heat sink is typically air. In the case of a liquid, the heat sink is typically water or ethylene glycol. In the case of a solid, it can be a heat pipe connected to an emitting radiative surface.

In this sense, the first phase change material 20 and the second phase change material 22 provide physical materials for heat storage during heat dissipation of the PCB during the transient duration. During exceptionally high heat or a prolonged transient heat condition, the first phase change material 20 and the second phase change material 22 will melt, changing phase from a solid to a liquid or a liquid to a gas. These changes of phase allows the first phase change material 20 and the second phase change material 22 to absorb additional heat during the high heat transient cycle for later dissipation. In such a scenario, the first phase change material 20 and the second phase change material 22, upon subsequent heat release occurring during the low heat portion of the operation cycle, will phase change back. The differences in the phase change temperatures of the first and second phase change materials 20 and 22 allow for series conduction for different types of heat loads. This includes that heat loads from electronic heat sources and environmental sources can be handled at once. Further, the heat sink assembly 10 may be used to cover a broader temperature range.

In another example of a transient thermal duration or transient heat condition, for example, a diurnal solar heating event or impingement of a high energy source on the external surface where the second phase change material 22 is located, at least one of the first phase change material 20 and/or the second phase change material 22 may absorb at least a portion of the heat lead, and by absorbing at least a portion of the heat load, it may prevent at least a portion of the heat load from reaching the electronic component 16. Stated another way, at least one of the first and/or second phase change materials 20, 22 may absorb a transient heat load originated form the component as well as from the environment.

Additional heat dissipation devices may be used in conjunction with the illustrated example such as air cooling fins or liquid cooling channels, to provide for increased heat relief. Moreover, the entire heat sink assembly 10 structure may be coated or painted with a black, high emissivity, low gloss material to ensure effective radiation heat transfer to the surrounding environment.

Figure 2A:
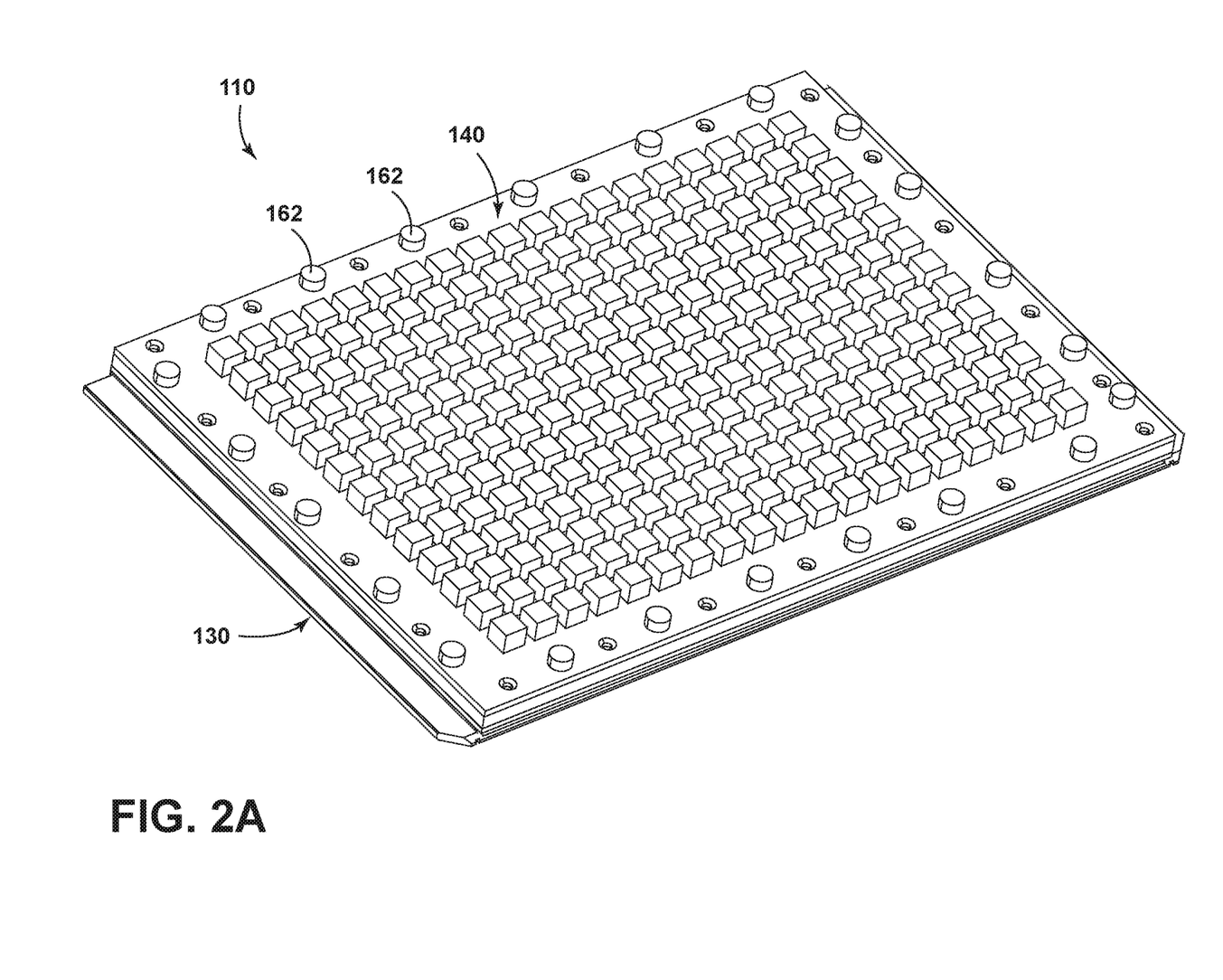
FIG. 2A illustrates an example perspective view of a heat sink assembly in accordance with various aspects described herein.
Figure 2B:
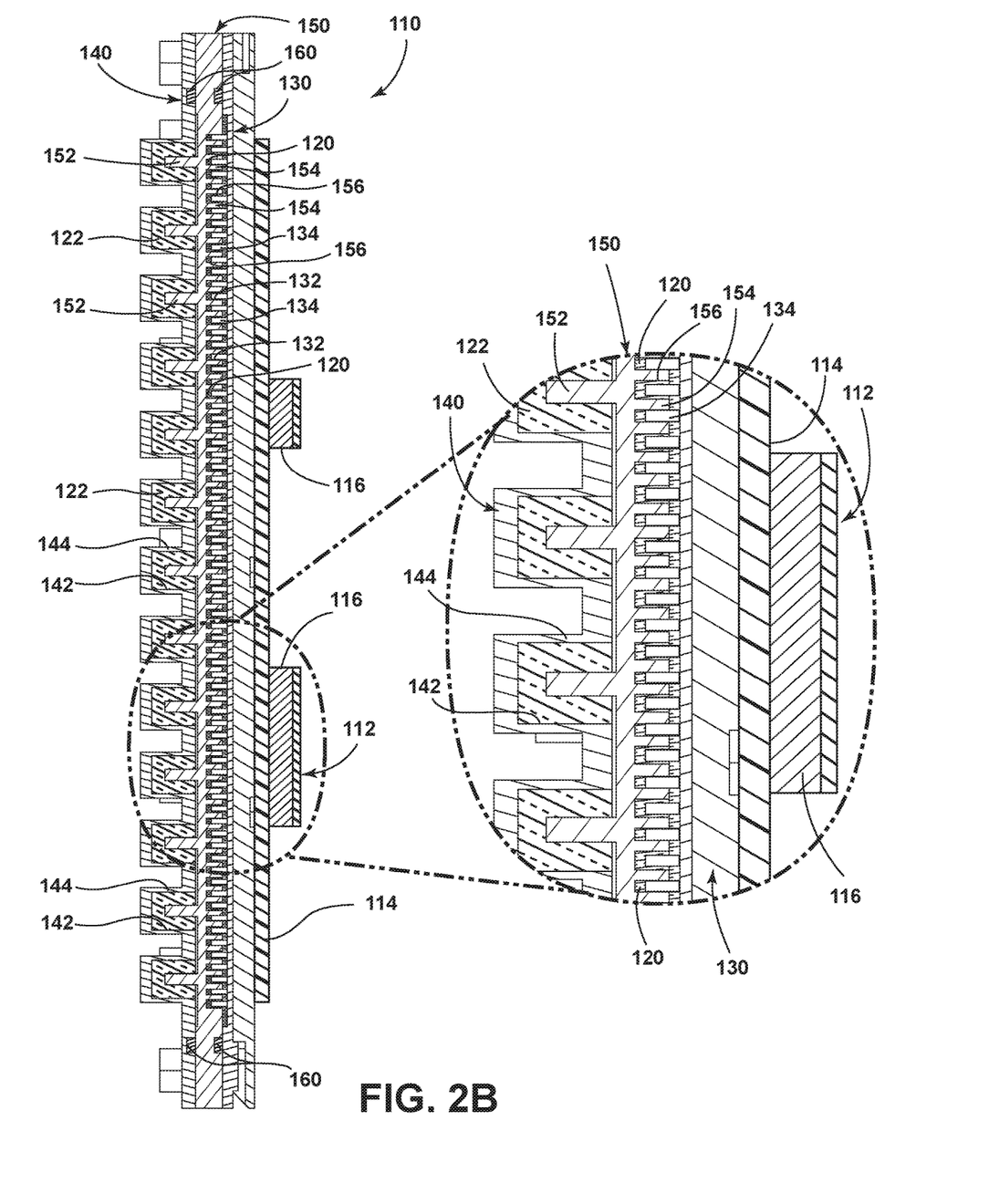
FIG. 2B illustrates an example cross-sectional view of the heat sink assembly of FIG. 2A.
Figure 2C:
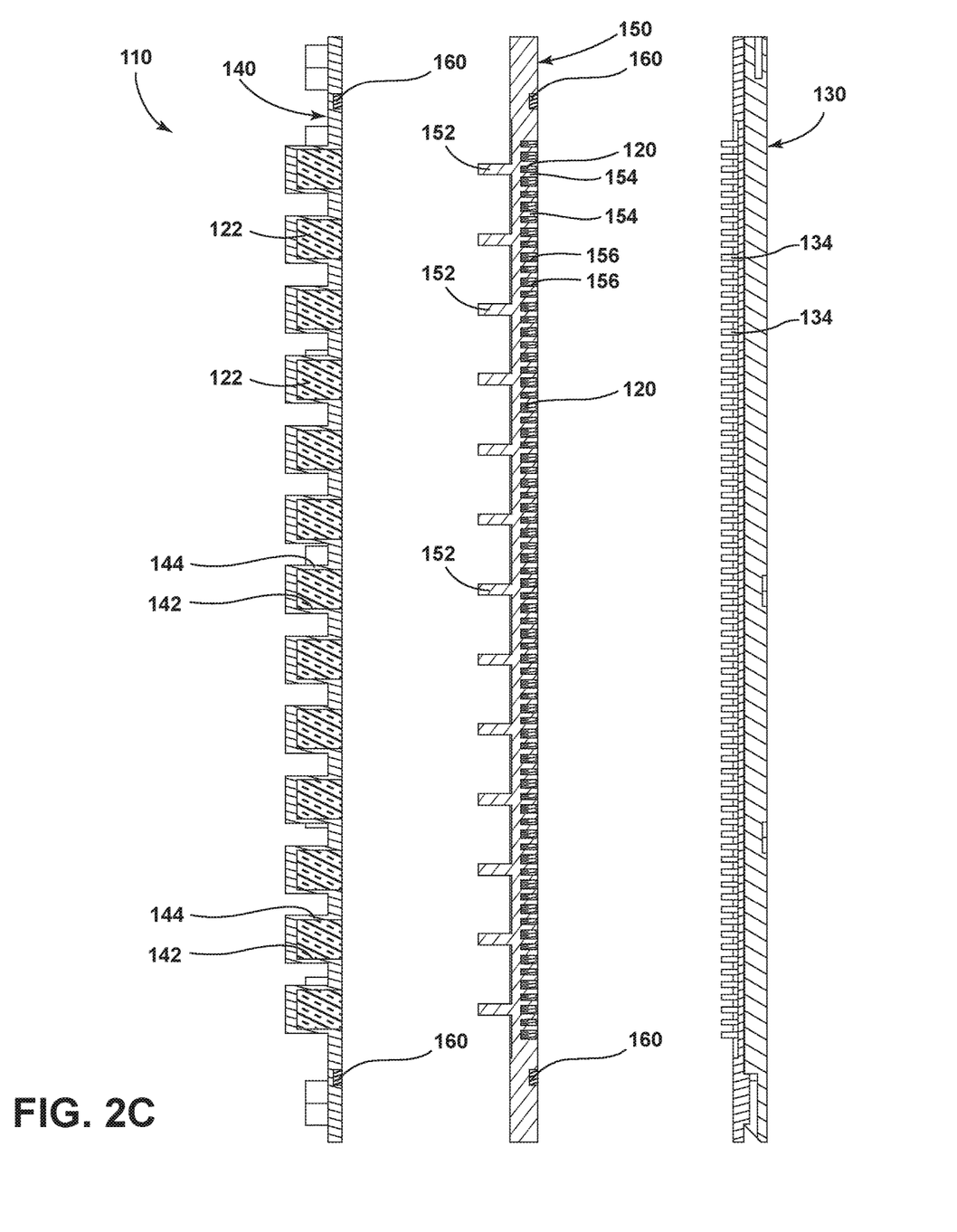
FIG. 2C illustrates an example partially exploded view of the heat sink assembly of FIG. 2A.

FIGS. 2A-2C illustrates an additional or alternative heat sink assembly 110 in accordance with aspects of the subject innovation. The heat sink assembly 110 has some common features with heat sink assembly 10; therefore, like parts will be identified with like numerals increased by 100, with it being understood that the description of the like parts of heat sink assembly 10 apply to heat sink assembly 110, unless otherwise noted.

FIG. 2A provides a perspective view, which illustrates that the chambers 142 (See FIG. 2C) may have a square cross section. As more clearly seen in FIG. 2B, one difference is that the frame 130 has been illustrated as having fins 134 and the intermediate heat-conducting structure 150 has been illustrated as having a plurality of chambers 156 formed by walls 154. The first phase change material 120 is located within the chambers 156 (more clearly seen in FIG. 2C) and the fins 134 extend into the chambers 156. The intermediate heat-conducting structure 150, like heat-sink assembly 10, includes fins 152, which extend into the second phase change material 122 located within the frame 140.

Heat-sink assembly 110 operates similarly to heat—sink assembly 10, except that heat is conducted through the frame 130 and its fins 134 into the first phase change material 120, which is housed in the intermediate heat-conducting structure 150. Heat is conducted from the first phase change material 120 through the intermediate heat-conducting structure 150 and its fins 152 and into the second phase change material 122 where it may then be conducted through the frame 140 to the ultimate heat sink material.

Figure 3A:
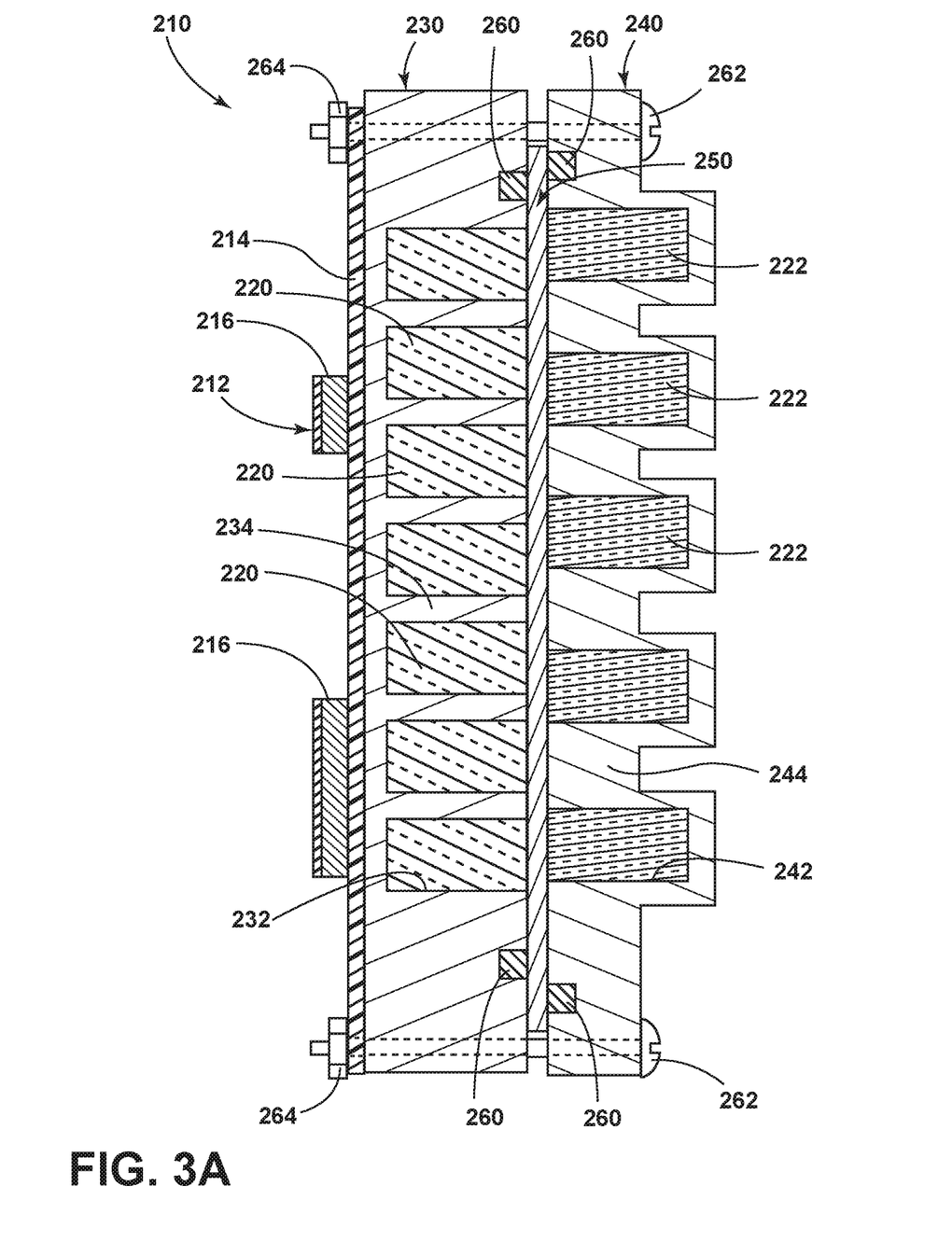
FIGS. 3A-3B illustrates an example heat sink assembly in accordance with various aspects described herein.
Figure 3B:
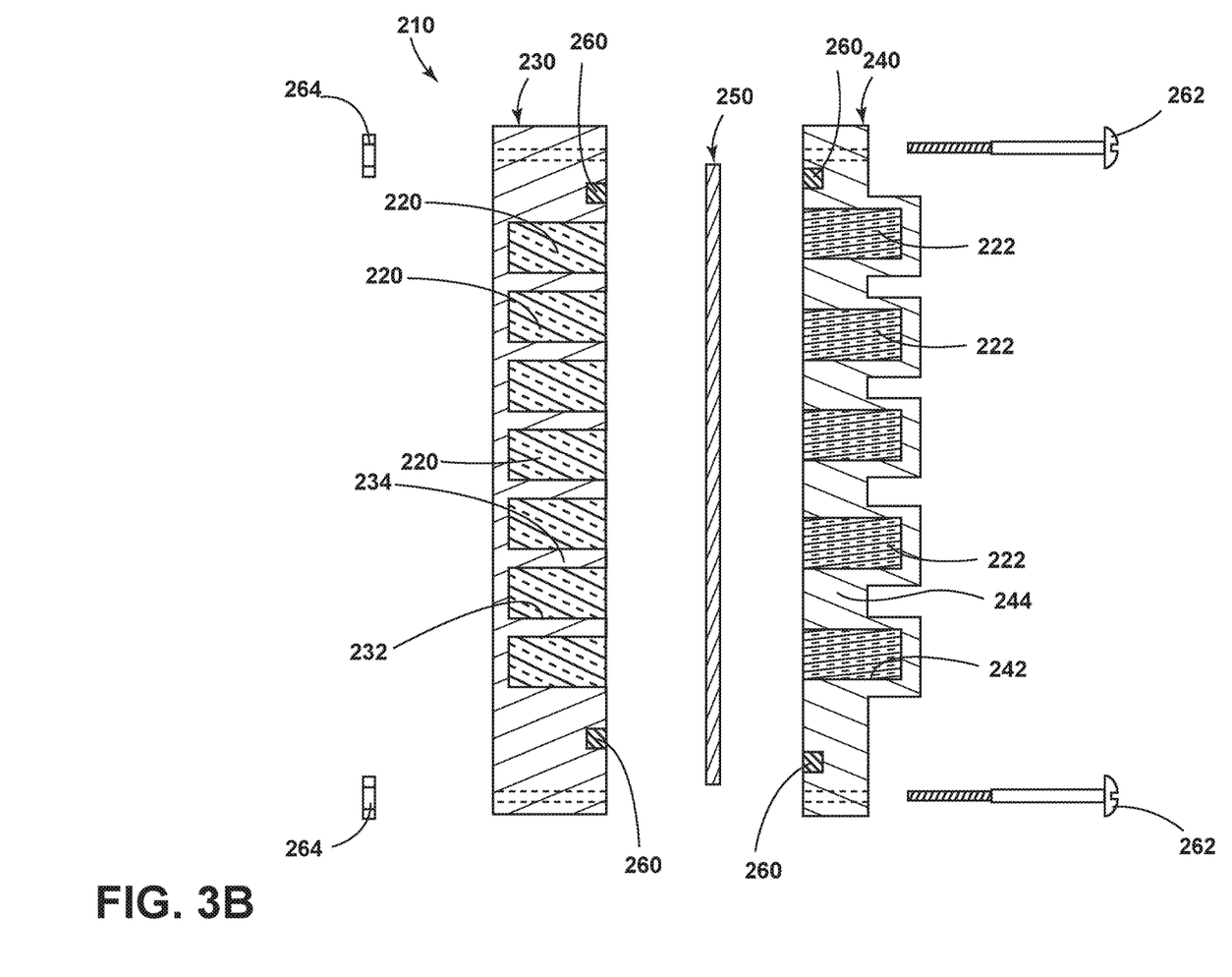

FIGS. 3A-3B illustrates an additional or alternative heat sink assembly 210 in accordance with aspects of the subject innovation. The heat sink assembly 210 has some common features with heat sink assembly 10; therefore, like parts will be identified with like numerals increased by 200, with it being understood that the description of the like parts of the heat-sink assembly 10 applies to heat sink assembly 210, unless otherwise noted.

One difference is that the intermediate heat-conducting structure 250 is illustrated as a thin plate having no fins. While it does not include fins, the intermediate heat-conducting structure 250 still forms a thermal interface between the first phase change material 220 and the second phase change material 222. The intermediate heat-conducting structure 250 also creates a barrier for isolating the first phase change material 220 from the second phase change material 222 to ensure that they do not mix.

Figure 4A:
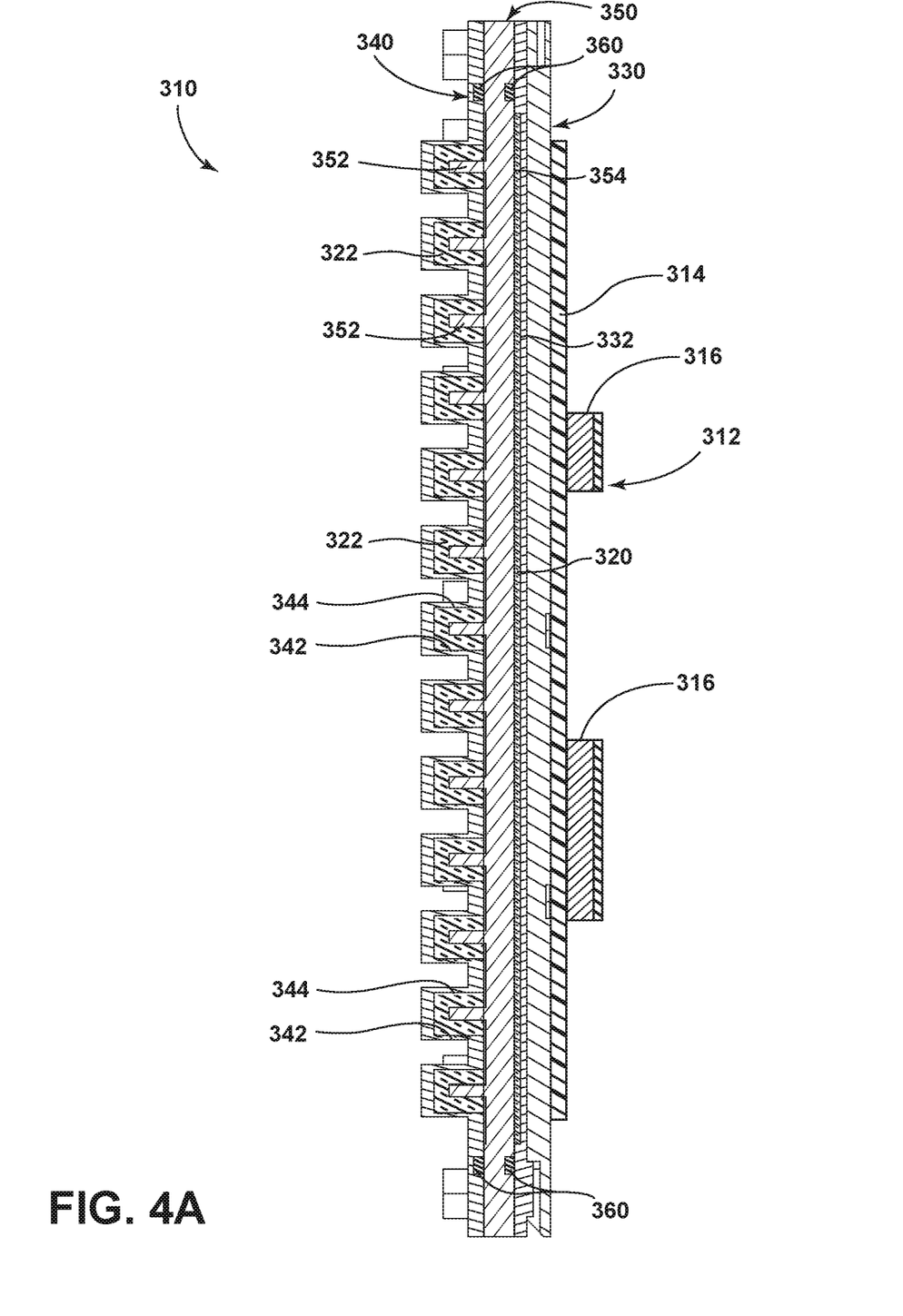
FIGS. 4A-4B illustrates an example heat sink assembly in accordance with various aspects described herein.
Figure 4B:
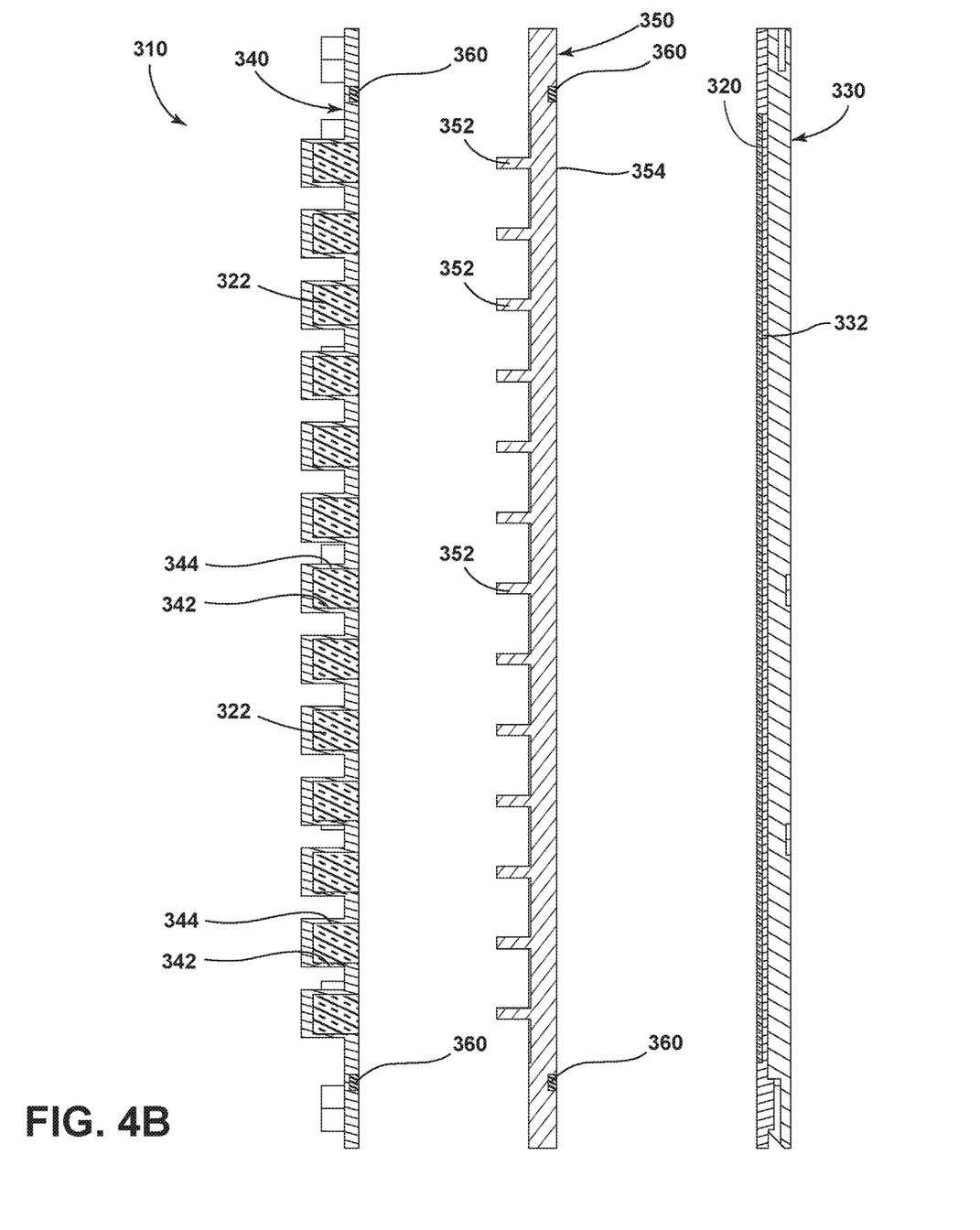

FIGS. 4A-4B illustrate an additional or alternative heat sink assembly 310 in accordance with aspects of the subject innovation. The heat sink assembly 310 has some common features with heat sink assembly 10; therefore, like parts will be identified with like numerals in the 300 series, with it being understood that the description of the like parts of the heat-sink assembly 10, heat-sink assembly 110 or heat-sink assembly 210 apply to heat-sink assembly 310, unless otherwise noted.

As with heat-sink assembly 10, the frame 330 holds the first phase change material 320. Unlike heat-sink assembly 10, the wall 334 of the frame 330 defines a single chamber 332 within which the first phase change material 320 is held. Another difference is that the intermediate heat-conducting structure 350 includes a first side 354, which is flat and includes fins 352 extending from its other side into the second phase change material 322 stored in the second frame 340.

The aspects disclosed herein provide heat sink assemblies having at least two phase change materials. The above-described aspects have superior weight and size advantages over the conventional cooling assemblies having air cooling fins or liquid cooling components. With the proposed phase change materials arrangement, a high heat dissipation can be achieved during transient heat conditions without additional heat dissipation elements since the reliable heat absorption of the phase change materials is inherent, providing heat storage within the physical material for later release during lower heat production conditions. Moreover, higher component reliability can be achieved even when components do not have high heat transient conditions because the phase change materials provides exceptional heat dissipation properties during steady state operation or reduced environmental cooling conditions, such as changes to environmental temperature under high solar settings.

Further, the above-described assemblies have a decreased number of parts and less electrical draw compared to an assembly having air or liquid cooling, making the complete system inherently more reliable. This results in a lower weight, smaller sized, increased performance, and increased reliability system. The lower number of parts and reduced maintenance will lead to a lower product costs and lower operating costs. Reduced weight and size correlate to competitive advantages.

Transient modes of power dissipation are common during electronic power dissipation cyclic heat loads and during diurnal environmental cycles. Transient modes of power dissipation exist in pulsed laser, radar, medical imaging, heat dissipation into fuel, and other transient heat load applications where high heat dissipation are expected over relatively short durations. The above-described embodiments may provide appropriate cooling for cyclic heat loads and diurnal changes related to temperature control under environmental temperature changes and solar loading conditions. The above-described embodiments provide compact and low cost solutions to integrating heat dissipating components to meet harsh environmental transient requirements with transient cyclic heat loads.

To the extent not already described, the different features and structures of the various embodiments may be used in combination with each other as desired. Some features may not be illustrated in all of the embodiments, but may be implemented if desired. Thus, the various features of the different embodiments may be mixed and matched as desired to form new embodiments, whether or not the new embodiments are expressly described. All combinations or permutations of features described herein are covered by this disclosure.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A heat sink assembly for use with at least one heat-emitting component, comprising:
    a first phase change material conductively coupled to the at least one heat-emitting component and changing phase at a first temperature;
    a first frame defining a first number of first chambers formed by first walls extending from a first side;
    the first phase change material disposed in the first chambers;
    a second frame defining a second number of second chambers formed by second walls extending from a second side facing the first side, wherein the second number is different from the first number;
    a second phase change material disposed in the second chambers, conductively coupled to the first phase change material and changing phase at a second temperature, which is greater than the first temperature; and
    a separate intermediate structure located between the first frame and the second frame wherein the intermediate structure is an intermediate heat-conducting structure comprising a plate and a first set of fins cantilevered from the plate extending in a first direction into respective ones of the first chambers, and a second set of fins cantilevered from the plate and extending in a second direction into respective ones of the second chambers, the first direction being opposite the second direction;
    wherein the first phase change material changes phase in response to a conductive transfer of heat from the at least one heat-emitting component and the second phase change material changes phase in response to a conductive transfer of heat from the first phase change material.

2. The heat sink assembly of claim 1 wherein the intermediate heat-conducting structure is located between the first phase change material and the second phase change material.

3. The heat sink assembly of claim 1 wherein at least a portion of the first frame is conductive.

4. The heat sink assembly of claim 3 wherein the at least a portion is in direct contact with the at least one heat-emitting component.

5. The heat sink assembly of claim 1 wherein heat is transferred from the second phase change material to a material exterior of the heat sink assembly.

6. The heat sink assembly of claim 1 wherein the first chambers and second chambers are offset from each other.

7. The heat sink assembly of claim 1 wherein the first number of first chambers is greater than the second number of second chambers.

8. A heat sink assembly for use with at least one heat-emitting component, comprising:
    a first frame including a first number of first chambers configured to hold a first phase change material that changes phase at a first temperature where the first frame has at least a portion conductively coupled to the at least one heat-emitting component;
    a second frame including a second number of second chambers configured to hold a second phase change material that changes phase at a second temperature, which is greater than the first temperature, wherein the second number is different from the first number; and
    a separate conductive element defining a structural barrier between the first phase change material and the second phase change material and conductively coupling the first phase change material and the second phase change material comprising a plate and a first set of fins cantilevered from the plate extending in a first direction into respective ones of the first chambers, and a second set of fins cantilevered from the plate and extending in a second direction into respective ones of the second chambers, the first direction being opposite the first second direction;
    wherein the first phase change material changes phase in response to a conductive transfer of heat from the at least one heat-emitting component and the second phase change material changes phase in response to a conductive transfer of heat from the first phase change material.

9. The heat sink assembly of claim 8 wherein the conductive element further comprises a plurality of fins extending into the first phase change material or the second phase change material.

10. The heat sink assembly of claim 8 wherein the first phase change material is a paraffin wax and the second phase change material is a different paraffin wax.

11. The heat sink assembly of claim 8 wherein the second frame has at least a portion that is conductive.

12. The heat sink assembly of claim 8 wherein the second frame further comprises fins.

13. The heat sink assembly of claim 8 wherein heat is transferred from the second phase change material to a material exterior of the heat sink assembly.

14. The heat sink assembly of claim 8 wherein the first number of first chambers are formed via a grid of interconnected walls.

15. The heat sink assembly of claim 8 wherein the conductive element is operably coupled to the first frame or the second frame.

16. The heat sink assembly of claim 8 wherein the first chambers and second chambers are offset from each other.

17. The heat sink assembly of claim 8 wherein the first number of first chambers is greater than the second number of second chambers.

* * * * *